(12) United States Patent
Qiao et al.

(10) Patent No.: US 12,256,624 B2
(45) Date of Patent: Mar. 18, 2025

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Zhenyang Qiao, Shenzhen (CN); Baixiang Han, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/638,101

(22) PCT Filed: Feb. 14, 2022

(86) PCT No.: PCT/CN2022/076178
§ 371 (c)(1),
(2) Date: Feb. 24, 2022

(87) PCT Pub. No.: WO2023/142173
PCT Pub. Date: Aug. 3, 2023

(65) Prior Publication Data
US 2024/0244927 A1    Jul. 18, 2024

(30) Foreign Application Priority Data
Jan. 25, 2022   (CN) .......................... 202210088279.8

(51) Int. Cl.
*H10K 59/80*   (2023.01)
*H10K 59/12*   (2023.01)

(52) U.S. Cl.
CPC ....... *H10K 59/873* (2023.02); *H10K 59/1201* (2023.02)

(58) Field of Classification Search
CPC ...................... H10K 59/873; H10K 59/1201
See application file for complete search history.

(56) References Cited

U.S. PATENT DOCUMENTS

2016/0218305 A1* 7/2016 Kim .................... H10K 59/124
2020/0310577 A1* 10/2020 Jeon .................... H10K 59/873

FOREIGN PATENT DOCUMENTS

CN    103050462 A    4/2013
CN    106959549 A    7/2017
(Continued)

OTHER PUBLICATIONS

Chinese Office Action issued in corresponding Chinese Patent Application No. 202210088279.8 dated Nov. 5, 2024, pp. 1-6, 13pp.

*Primary Examiner* — Mohammed R Alam
(74) *Attorney, Agent, or Firm* — The Roy Gross Law Firm, LLC; Roy Gross (57) ABSTRACT

A display panel and a manufacturing method thereof are provided. The display panel comprises a first substrate, a driving circuit layer disposed on a side of the first substrate, a light-emitting device layer disposed on a side of the driving circuit layer away from the first substrate, a second substrate disposed on a side of the light-emitting device layer away from the driving circuit layer, and a stress releasing layer disposed on a side of the second substrate close to the light-emitting device layer. The stress releasing layer is disposed corresponding to the non-display region, and a concave section is disposed in the stress releasing layer.

17 Claims, 6 Drawing Sheets

(56) References Cited

FOREIGN PATENT DOCUMENTS

| | | | |
|---|---|---|---|
| CN | 108878687 | A | 11/2018 |
| CN | 208127245 | U | 11/2018 |
| CN | 109119450 | A | 1/2019 |
| CN | 109728196 | A | 5/2019 |
| CN | 109802053 | A | 5/2019 |
| CN | 110211998 | A | 9/2019 |
| JP | H06214110 | A | 8/1994 |

* cited by examiner

DISPLAY PANEL AND MANUFACTURING METHOD THEREOF

CROSS REFERENCE TO RELATED APPLICATIONS

This application is a National Phase of PCT Patent Application No. PCT/CN2022/076178 having International filing date of Feb. 14, 2022, which claims the benefit of priority of Chinese Application No. 202210088279.8 filed on Jan. 25, 2022. The contents of the above applications are all incorporated by reference as if fully set forth herein in their entirety.

BACKGROUND OF INVENTION

Field of Invention

The present application relates to a display field, and specifically relates to a display panel and a manufacturing method thereof.

Description of Prior Art

Organic light emitting diodes (OLEDs) are also known as organic electroluminesence displays or organic light emitting semiconductors. Compared to traditional liquid crystal displays (LCDs), OLED displays have excellent characteristics such as no backlight required, low driving voltage, light weight and thinness, wide viewing angle, high contrast ratio, fast response rate, and bendability, etc, and they are widely used in mobile phones, digital cameras, digital versatile disc (DVD) players, notebook computers, televisions (TVs), and other display fields.

For foldable display panels, in order to adjust a neutral plane of non-display regions of the display panels, color filter layers are extended to the non-display regions. However, when the non-display regions of the display panel are bent for many times, the color filter layers in the non-display regions are easily fractured, causing water vapor and oxygen to enter the display regions from a fragmentation position, affecting display effect of the display panels, reducing reliability of the display panels, and limiting development of flexible display technology.

SUMMARY OF INVENTION

Embodiments of the present application provides a display panel and a manufacturing method thereof, which can solve the technical problem that film layers in the non-display regions are easily fractured, after the display panels have been bent for many times.

One embodiment of the present application provides a display panel, including a display region and a non-display region located on a side of the display region. The display panel includes:
  a first substrate;
  a driving circuit layer disposed on a side of the first substrate;
  a light-emitting device layer disposed on a side of the driving circuit layer away from the first substrate;
  a second substrate disposed opposite to the first substrate, wherein the driving circuit layer and the light-emitting device layer are located between the first substrate and the second substrate; and
  a stress releasing layer disposed on a side of the second substrate close to the first substrate, wherein the stress releasing layer is disposed corresponding to the non-display region, and a concave section is disposed in the stress releasing layer.

Optionally, in some embodiments of the present application, the stress releasing layer includes a plurality of color resist blocks spaced apart;
  the concave section includes a plurality of first grooves extending along a first direction, the plurality of first grooves are arranged along a second direction, the first direction intersects with the second direction, and
  the first grooves are defined between two adjacent color resist blocks arranged along the second direction.

Optionally, in some embodiments of the present application, a width of the first grooves is gradually expanded from a direction of the second substrate toward the first substrate.

Optionally, in some embodiments of the present application, the first direction and the second direction are perpendicular.

Optionally, in some embodiments of the present application, the concavity second direction includes a plurality of second grooves extending along the second direction, the plurality of second grooves are arranged along the first direction, the first grooves communicate with the second grooves, and
  the second grooves are defined between two adjacent color resist blocks arranged along the first direction.

Optionally, in some embodiments of the present application, a width of the second grooves is gradually expanded from a direction of the second substrate toward the first substrate.

Optionally, in some embodiments of the present application, the concave section further includes via holes defined in the color resist blocks.

Optionally, in some embodiments of the present application, a cross-sectional area of the via holes is gradually expanded from a direction of the second substrate toward the first substrate.

Optionally, in some embodiments of the present application, a cross section of the via holes is circular, oval, or polygonal.

Optionally, in some embodiments of the present application, the color resist blocks are a stacked structure selected from one or at least two consisting of a red color resist, a green color resist, and a blue color resist.

Optionally, in some embodiments of the present application, the display panel further includes a color filter layer, the light shielding layer is disposed on a side of the second substrate close to the light-emitting device layer, the color filter layer is disposed corresponding to the display region, and the color filter layer includes the red color resist, the green color resist, and the blue color resist.

Optionally, in some embodiments of the present application, the display panel further includes a light shielding layer, the light shielding layer is disposed on the side of the second substrate close to the light-emitting device layer, a plurality of accommodating grooves are defined corresponding to the display region in the light shielding layer, and the red color resist, the green color resist, and the blue color resist of the display region are correspondingly disposed in the accommodating grooves, and the color resist blocks are disposed on a side of the light shielding layer close to the light-emitting device layer.

Optionally, in some embodiments of the present application, heights of two adjacent color resist blocks are different.

Optionally, in some embodiments of the present application, between two adjacent color resist blocks, one of the two adjacent color resist blocks is one of a red color resist, a green color resist, or a blue color resist, and another one of the two adjacent color resists is a stacked structure including two or three of the red color resist, the green color resist, or the blue color resist.

Optionally, in some embodiments of the present application, between two adjacent color resist blocks, one of the two adjacent color resists is a stacked structure including two of a red color resist, a green color resist, or a blue color resist, and another one of the two adjacent color resists is a stacked structure including the red color resist, the green color resist, or the blue color resist.

Optionally, in some embodiments of the present application, the display panel includes an encapsulation layer covering the light-emitting device layer, and a thickness of the non-display region of the first substrate is less than a thickness of the display region of the first substrate.

Optionally, in some embodiments of the present application, the driving circuit layer includes an active layer, a gate insulation layer disposed on a side of the active layer facing away from the first substrate, a gate electrode layer disposed on a side of the gate insulation layer facing away from the active layer, a first insulation layer covering on the gate electrode and the active layer, and a source-drain electrode metal layer disposed on the first insulation layer; and
    a thickness of a section of the first insulation layer corresponding to the non-display region is less than a thickness of a section of the first insulation layer corresponding to the display region.

One embodiment of the present application further provides a manufacturing method of the display panel. The display panel includes a display region and a non-display region located on a side of the display region. The manufacturing method of the display panel includes following steps:
    forming a driving circuit layer and a light-emitting device layer on a first substrate, wherein the driving circuit layer is disposed on a side of the first substrate, and the light-emitting device layer is disposed on a side of the driving circuit layer away from the first substrate;
    forming a stress releasing layer on a second substrate, wherein the stress releasing layer is disposed corresponding to the non-display region, and a concave section is disposed in the stress releasing layer; and
    fixing the second substrate on a side of the first substrate, wherein the driving circuit layer, the light-emitting device layer, and the stress releasing layer are located between the first substrate and the second substrate.

Optionally, in some embodiments of the present application, the step of forming the stress releasing layer on the second substrate includes:
    forming a light shielding layer on the second substrate, wherein a plurality of accommodating grooves are defined corresponding to the display region in the light shielding layer, and
    forming a color filter layer and a stress releasing layer on the second substrate, the color filter layer is disposed corresponding to the display region, and wherein the stress releasing layer is disposed corresponding to the non-display region, and the color filter layer includes a red color resist, a green color resist, and a blue color resist disposed in the display region, and the red color resist, the green color resist, and the blue color resist of the display region are correspondingly disposed in the accommodating grooves; and
    disposing the color filter layer and the stress releasing layer on a side of the light shielding layer close to the light-emitting device layer, after the second substrate is fixed on the side of the first substrate.

Optionally, in some embodiments of the present application, in the step of forming the color filter layer and the stress releasing layer on the second substrate, the stress releasing layer includes a plurality of color resist blocks, the plurality of color resist blocks are spaced apart, and the color resist blocks are a stacked structure selected from one or at least two consisting of the red color resist, the green color resist, and the blue color resist.

The display panel and the manufacturing method are adopted in the embodiments of the present application. By disposing the stress releasing layer having the concave section at the position of the second substrate corresponding to the non-display region, when the display panel is bent, the concave section can serve an effect of releasing stress to prevent film layers in the non-display region from being fractured when a bending radius is small, which can prevent water vapor and oxygen from entering the display region from a fragmentation position of the non-display region to improve reliability of the display panel and to reduce failure risk of the display panel.

DESCRIPTION OF DRAWINGS

To more clearly illustrate embodiments or the technical solutions of the present application, the accompanying figures of the present application required for illustrating embodiments or the technical solutions of the present application will be described in brief. Obviously, the accompanying figures described below are only part of the embodiments of the present application, from which figures those skilled in the art can derive further figures without making any inventive efforts.

DETAILED DESCRIPTION OF EMBODIMENTS

The technical solutions in the embodiments of the present application are clearly and completely described in the following with reference to the accompanying drawings in the embodiments of the present application. Obviously, the described embodiments are only part of the embodiments of the present disclosure, but are not all embodiments of the present disclosure. All other embodiments obtained by those skilled in the art based on the embodiments of the present application without creative efforts are within the scope of the present application. Besides, it should be understood that the specific embodiments described herein are merely for describing and explaining the present application and are not intended to limit the present application. In the present application, unless opposite stated, the orientation words used such as "upper" and "lower" generally refer to the upper and lower directions of the device in actual using or working state, and specifically refer to the drawing directions in the drawings, and "inner" and "outer" refer to the outline of the device.

Embodiments of the present application provide a display panel and a manufacturing method thereof. The details are described below respectively. It should be noted that a description order of the following embodiments is not intended to limit a preferred order of the embodiments.

Figure 1:
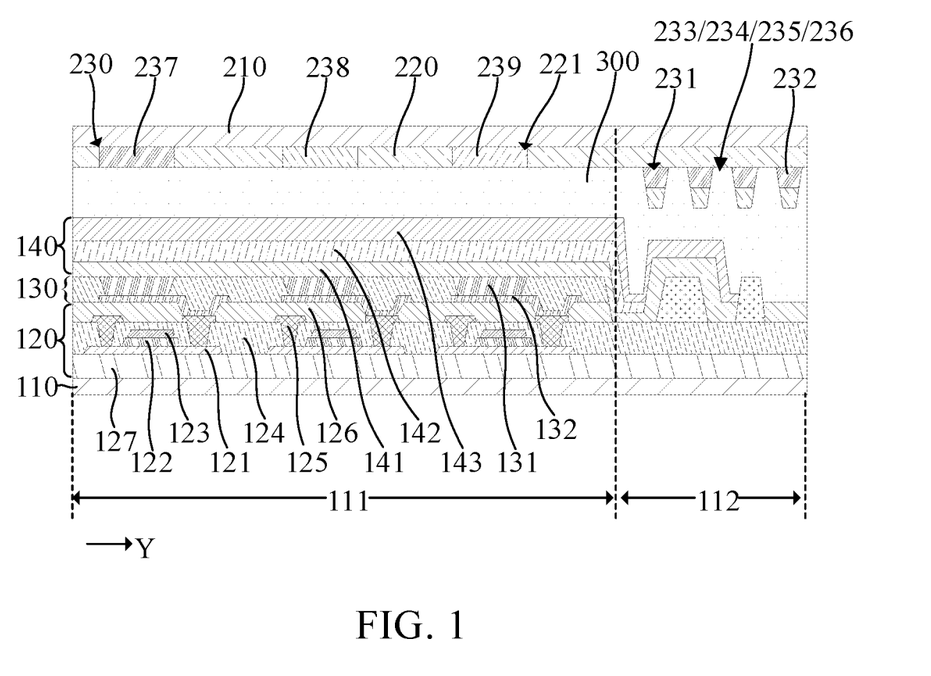
FIG. 1 is a structural schematic diagram of a sectional view of a first display panel provided by one embodiment of the present application.

Please refer to FIG. 1, one embodiment of the present application provides a display panel, including a display region 111 and a non-display region 112. The non-display region 112 is located on a side of the display region 111. In one embodiment of the present application, the non-display region 112 is disposed on a peripheral side of the display region 111, i.e., the non-display region 112 is disposed around the display region 111. Of course, the non-display region 112 can be disposed only on one side of the display region 111 according to an actual selection and specific requirements, which is not limited herein.

The display panel includes a first substrate 110, a driving circuit layer 120, and a light-emitting device layer 130. The driving circuit layer 120 is disposed on a side of the first substrate 110. The light-emitting device layer 130 is disposed on a side of the driving circuit layer 120 away from the first substrate 110. In this embodiment, the light-emitting device layer 130 is electrically connected to the driving circuit layer 120. The driving circuit layer 120 energizes the light-emitting device layer 130, thereby driving the light-emitting device layer 130 to emit light.

The display panel includes a second substrate 210 and a stress releasing layer 231. The second substrate 210 is disposed opposite to the first substrate 110. The driving circuit layer 120 and the light-emitting device layer 130 are disposed between the first substrate 110 and the second substrate 210. The stress releasing layer 231 is disposed on a side of the second substrate 210 close to the first substrate 110. The stress releasing layer 231 is disposed corresponding to the non-display region 112. A concave section 233 is disposed in the stress releasing layer 231.

In the display panel of one embodiment of the present application, by disposing the stress releasing layer 231 having the concave section 233 at the position of the second substrate 210 corresponding to the non-display region 112, when the display panel is bent, the concave section 223 can serve an effect of releasing stress to prevent film layers in the non-display region 112 from being fractured when a bending radius is small. Water vapor and oxygen entering the display region 111 from a fragmentation position of the non-display region 112 can be prevented, which can improve reliability of the display panel and reduce failure risk of the display panel.

Figure 2:
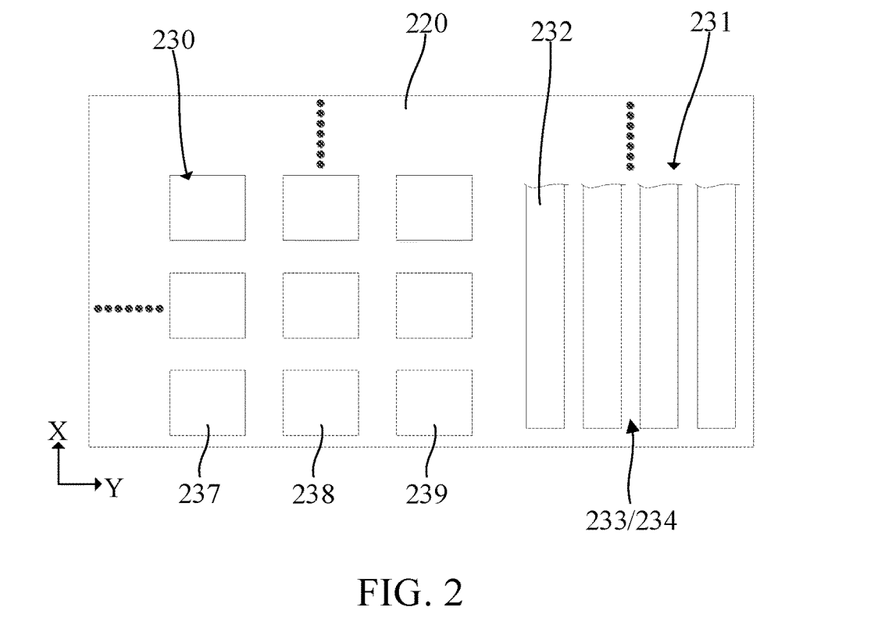
FIG. 2 is a first structural schematic diagram of a top view of a second substrate provided by one embodiment of the present application.

Specifically, as illustrated in FIG. 1 and FIG. 2, the concave section 223 includes a plurality of first grooves 234 extending along the first direction X. The plurality of first grooves 234 are arranged along a second direction Y. The first direction X intersects with the second direction Y. The stress releasing layer 231 includes a plurality of color resist blocks 232. The plurality of color resist blocks 232 are spaced apart. The first grooves 234 are defined between two adjacent color resist blocks 232 arranged along the second direction Y. In this structure, when the display panel is bent along the second direction Y, the concave section 234 can serve an effect of releasing stress to prevent film layers in the non-display region 112 from being fractured, which effectively prevents water vapor and oxygen from entering the display region 111 from a fragmentation position of the non-display region 112 to improve reliability of the display panel and to reduce failure risk of the display panel. In one embodiment of the present application, the first direction X and the second direction Y are perpendicular. Of course, the first direction X and the second direction Y can also be configured to intersect at other angles according to an actual selection and specific requirements, which is not limited herein.

Specifically, a width of the first grooves 234 is gradually expanded from a direction of the second substrate 210 toward the first substrate 110. In this structure, when a bending radius of the display panel is relative small, the concave section 234 can provide sufficient space conducive moving of the color resist blocks 232. The concave section 234 can release stress better, thereby preventing film layers in the non-display region 112 from being fractured, which effectively prevents water vapor and oxygen from entering the display region 111 from the fragmentation position of the non-display region 112 to improve reliability of the display panel and to reduce failure risk of the display panel.

Figure 3:
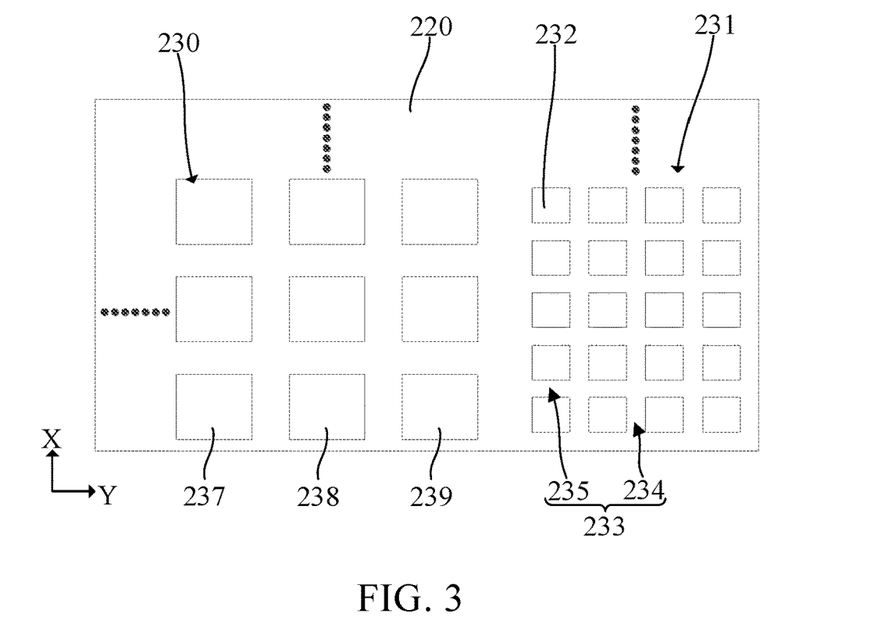
FIG. 3 is a second structural schematic diagram of a top view of the second substrate provided by one embodiment of the present application.

Specifically, as illustrated in FIG. 1 and FIG. 3, the concave section 223 further includes a plurality of second grooves 235 extending along the second direction X. The plurality of second grooves 235 are arranged along the first direction X. The first grooves 234 communicate with the second grooves 235. The second grooves 235 are defined between two adjacent color resist blocks 232 arranged along the first direction X. In this structure, when the display panel is bent along the first direction X, the second grooves 235 can serve an effect of releasing stress to prevent film layers in the non-display region 112 from being fractured, which effectively prevents water vapor and oxygen from entering the display region 111 from a fragmentation position of the non-display region 112 to improve reliability of the display panel and to reduce failure risk of the display panel. In this embodiment, the plurality of color resist blocks 232 are distributed in an array manner along the first direction X and the second direction Y. Of course, the plurality of color resist blocks 232 can be distributed according to other manner according to an actual selection and specific requirements, which is not limited herein.

Specifically, a width of the second grooves 235 is gradually expanded from the direction of the second substrate 210 toward the first substrate 110. In this structure, when a bending radius of the display panel is relative small, the second grooves 235 can provide sufficient space conducive moving of the color resist blocks 232. The second grooves 235 can release stress better, thereby preventing film layers in the non-display region 112 from being fractured, which effectively prevents water vapor and oxygen from entering the display region 111 from the fragmentation position of the non-display region 112 to improve reliability of the display panel and to reduce failure risk of the display panel.

Figure 4:
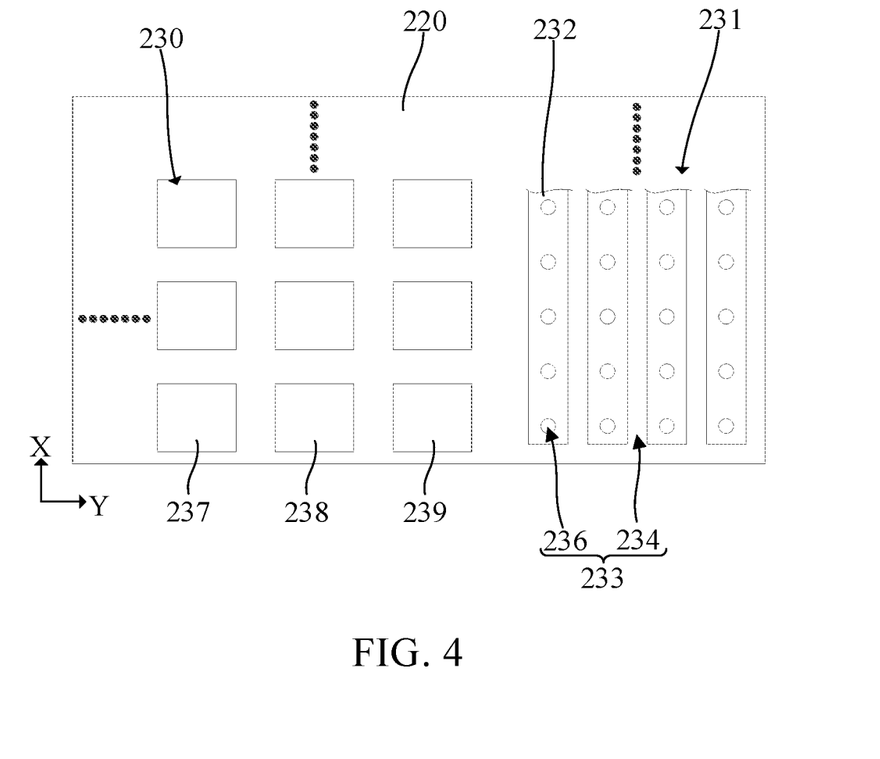
FIG. 4 is a third structural schematic diagram of a top view of the second substrate provided by one embodiment of the present application.
Figure 5:
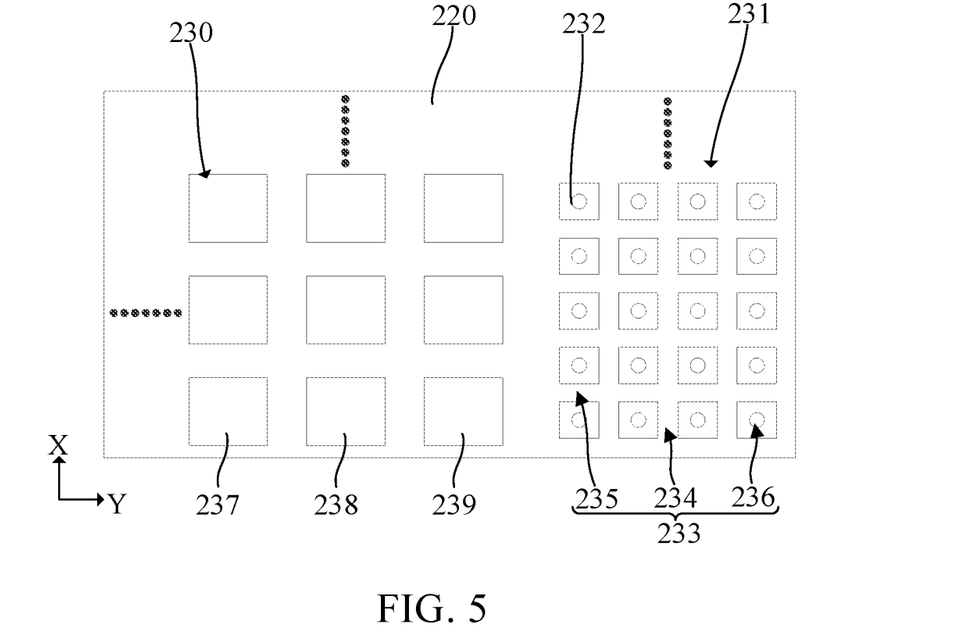
FIG. 5 is a fourth structural schematic diagram of a top view of the second substrate provided by one embodiment of the present application.

Specifically, as illustrated in FIG. 1, FIG. 4, and FIG. 5, the concave section 233 further includes via holes 236 defined in the color resists 232. In this structure, the via holes 236 can improve deformation ability of the color resist blocks 232 and greatly improve flexibility of the display panel, thereby preventing the film layers in the non-display region 112 from being fractured, which effectively prevents water vapor and oxygen from entering the display region 111 from a fragmentation position of the non-display region 112 to improve reliability of the display panel and to reduce failure risk of the display panel.

Specifically, a cross-sectional area of the via holes 236 is gradually expanded from a direction of the second substrate 210 toward the first substrate 110. In this structure, when a bending radius of the display panel is relative small, the via holes 236 can provide sufficient space conducive moving of the color resist blocks 232. The via holes 236 can release stress better, thereby preventing film layers in the non-display region 112 from being fractured, which effectively prevents water vapor and oxygen from entering the display region 111 from the fragmentation position of the non-display region 112 to improve reliability of the display panel and to reduce failure risk of the display panel.

Specifically, as illustrated in FIG. 4 and FIG. 5, a cross-sectional shape of the via holes 236 can be circular. Of course, the cross-sectional shape of the via holes 236 can also be other shapes according to an actual selection and specific requirements, for example, the cross-sectional shape of the via holes 236 can be oval or polygonal, which is not limited herein.

Specifically, as illustrated in FIG. 1, the display panel further includes a light filter layer 230. The light shielding layer 230 is disposed on a side of the second substrate 210 close to the light-emitting device layer 130. The light filter layer 230 is disposed corresponding to the display region 111. The color filter layer 230 includes the red color resist 237, the green color resist 238, and the blue color resist 239.

Specifically, as illustrated in FIG. 1, the color resist blocks 232 are a stacked structure selected from one or at least two consisting of the red color resist 237, the green color resist 238, and the blue color resist 239. In this structure, when the color resist blocks 232 include the red color resist 237, the red color resist 237 of the color resist blocks 232 and the red color resist 237 of the display region 111 can be formed simultaneously; when the color resist blocks 232 include the green color resist 238, the green color resist 238 of the color resist blocks 232 and the green color resist 238 of the display region 111 can be formed simultaneously; and when the color resist blocks 232 include the blue color resist 239, the blue color resist 239 of the color resist blocks 232 and the blue color resist 239 of the display region 111 can be formed simultaneously. There is no need to increase masks and processes for manufacturing the color resist blocks 232, this process is simple, flexible, and adjustable.

As illustrated in FIG. 1, in the display panel of one embodiment of the present application, the color resist blocks 232 are a stacked structure of the red color resist 237 and the green color resist 238. Of course, the color resist blocks 232 can only include one kind of color resists according to an actual selection and specific requirements. For example, the color resist blocks 232 can be the red color resist 237, the green color resist 238, or the blue color resist 239. The color resist blocks 232 can include two kind of color resists, for example, the color resist blocks 232 can be a stacked structure including the red color resist 237 and the blue color resist 239; or the color resist blocks 232 can be a stacked structure including the green color resist 238 and the blue color resist 239; or the color resist blocks 232 can be a stacked structure including the red color resist 237 and the green color resist 238. The color resist blocks 232 can include three kind of color resists, for example, the color resist blocks 232 can be a stacked structure including the red color resist 237, the green color resist 238, and the blue color resist 239, which are not limited herein.

Figure 6:
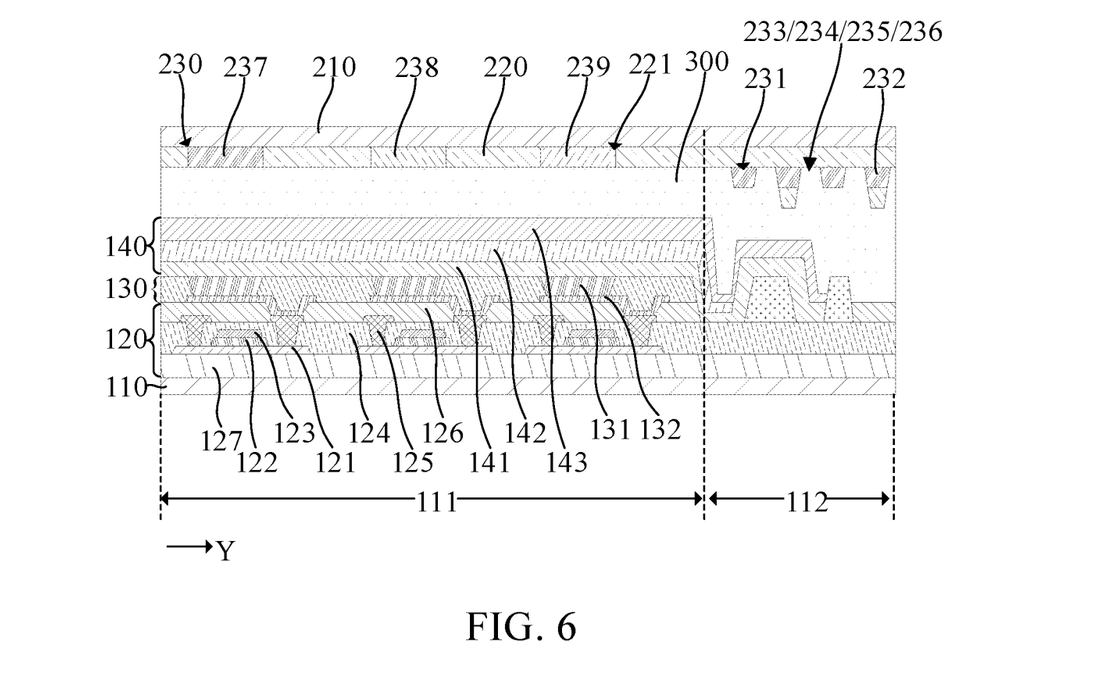
FIG. 6 is a structural schematic diagram of a sectional view of a second display panel provided by one embodiment of the present application.

Specifically, as illustrated in FIG. 6, heights of two adjacent color resist blocks 232 are different. In this structure, when the display panel is bent, adjacent color resist blocks 232 cannot interfere and squeeze each other, thereby preventing film layers in the non-display region 112 from being fractured, which effectively prevents water vapor and oxygen from entering the display region 111 from a fragmentation position of the non-display region 112 to improve reliability of the display panel and to reduce failure risk of the display panel.

As illustrated in FIG. 6, in the display panel of one embodiment of the present application, between two adjacent color resist blocks 232, one of the color resist blocks 232 includes the red color resist 237, and another color resist block 232 includes the red color resist 237 and the green color resist 238. In the present application, a height difference between two adjacent color resist blocks 232 is adjusted by adjusting a number of color resist layers. For example, between two adjacent color resist blocks 232, one of the color resist blocks 232 is one of the red color resist 237, the green color resist 238, or the blue color resist 239, and another color resist block 232 is a stacked structure including two or three of the red color resist 237, the green color resist 238, or the blue color resist 239; or between the two adjacent color resist blocks 232, one of the color resist blocks 232 is a stacked structure including two of the red color resist 237, the green color resist 238, or the blue color resist 239; and another color resist block 232 is a stacked structure including the red color resist 237, the green color resist 238, and the blue color resist 239.

Figure 7:
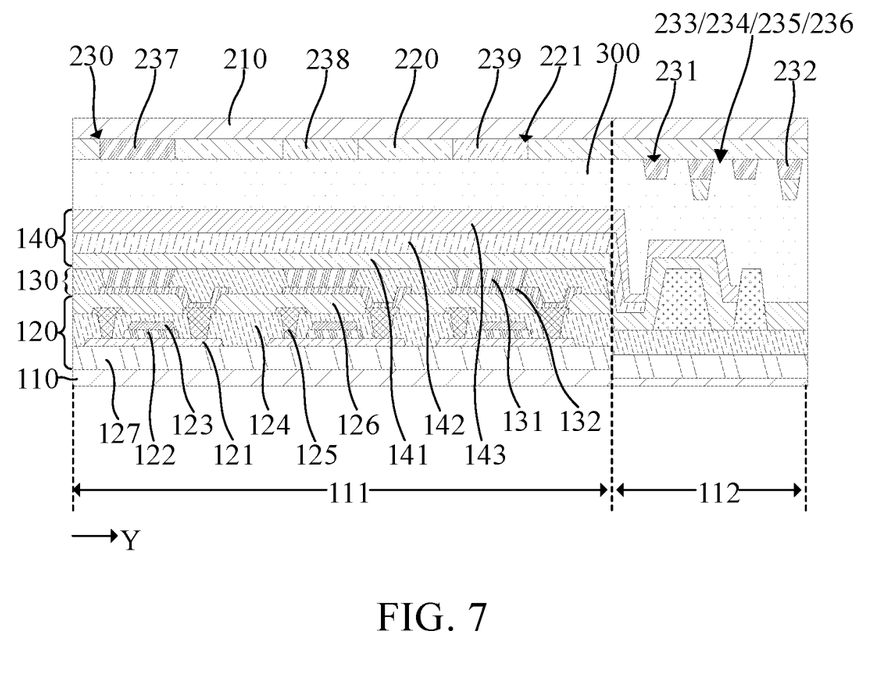
FIG. 7 is a structural schematic diagram of a sectional view of a third display panel provided by one embodiment of the present application.

Specifically, as illustrated in FIG. 1, FIG. 6 and FIG. 7, the display panel further includes an encapsulation layer 140 covering the light-emitting device layer 130. The encapsulation layer 140 is located on a side of the color filter layer 230 close to the light-emitting device layer 130. A thickness of the non-display region 112 of the first substrate 110 is less than a thickness of the display region 111 of the first substrate 110. In this structure, by making the thickness of the non-display region 112 of the first substrate 110 to be thinner than the thickness of the display region 111 of the first substrate 110, a part of the encapsulation layer 140 corresponding to the non-display region 112 can be adjusted to the neutral plane of the display panel, which increases the bending radius of the encapsulation layer 140 and prevents an fragmentation situation of the encapsulation layer 140 from occurring when the display panel is bent. In this embodiment, by adding stress releasing layer 231 in the non-display region 112, the part of the encapsulation layer 140 corresponding to the non-display region 112 can be adjusted to the neutral plane of the display panel, which increases the bending radius of the encapsulation layer 140 and prevents an fragmentation situation of the encapsulation layer 140 from occurring when the display panel is bent.

Specifically, the encapsulation layer 140 includes a first inorganic layer 141, an organic layer 142, and a second inorganic layer 143. The first inorganic layer 141 covers on a side of the light-emitting device layer 130 away from the driving circuit layer 120. The organic layer 142 covers a side of the first inorganic layer 141 away from the light-emitting device layer 130. The second inorganic layer 143 covers a side of the organic layer 142 away from the first inorganic layer 141. Therefore, water vapor and oxygen eroding the light-emitting device layer 130 and the driving circuit layer 120 is prevented, reliability of the display panel is improved, and failure risk of the display panel is reduced.

Specifically, as illustrated in FIG. 1, FIG. 6, and FIG. 7, in the display panel of one embodiment of the present application, the display panel further includes a light shielding layer 220. The light shielding layer 220 can be but is not limited to black matrices. The light shielding layer 220 is disposed on a side of the second substrate 210 close to the light-emitting device layer 130. The light shielding layer 220 is disposed corresponding to the display region 111 and the non-display region 112. A plurality of accommodating grooves 221 are defined corresponding to the display region 111 in the light shielding layer 220. The accommodating grooves 221 are defined to penetrate the light shielding layer 220. The red color resist 237, the green color resist 238, and the blue color resist 239 of the display region 111 are disposed in corresponding accommodating grooves 221. The stress releasing layer 231 (color resist blocks 232) are disposed on a side of the light shielding layer 220 close to the light-emitting device layer 130.

Specifically, as illustrated in FIG. 1, FIG. 6 and FIG. 7, the driving circuit layer 120 includes a buffer layer 127, an active layer 121 disposed on a side of the buffer layer 127 facing away from the first substrate 110, a gate insulation layer 122 disposed on a side of the active layer 121 facing away from the first substrate 110, a gate electrode layer 123 disposed on a side of the gate insulation layer 122 facing away from the active layer 121, a first insulation layer 124 covering on the gate electrode and the active layer 121, a source-drain electrode metal layer 125 disposed on the first insulation layer 124; and a second insulation layer 126 disposed on the source-drain electrode metal layer 125 and the first insulation layer 124. A thickness of a section of the first insulation layer 124 corresponding to the non-display region 112 is less than a thickness of a section of the first insulation layer 124 corresponding to the display region 111. In this structure, by making the thickness of the first insulation layer 124 corresponding to the non-display region 112 to be thinner than the thickness of the first insulation layer 124 corresponding to the display region 111, a part of the encapsulation layer 140 corresponding to the non-display region 112 can be adjusted to the neutral plane of the display panel, which increases the bending radius of the encapsulation layer 140 and prevents an fragmentation situation of the encapsulation layer 140 from occurring when the display panel is bent.

Specifically, as illustrated in FIG. 1, FIG. 6 and FIG. 7, the light-emitting device layer 130 includes a plurality of organic light emitting diode (OLED) device 131 disposed in the display region 111. The plurality of OLED devices 131 are distributed in an array manner. Each OLED device 131 corresponds to one of the red color resist 237, the green color resist 238, and the blue color resist 239 in the display region 111. In this embodiment, the OLED devices 131 include an anode 132 disposed on the second insulation layer 126, a light-emitting functional layer disposed on the anode 132, and a cathode disposed on the light-emitting functional layer. The anode 132 is electrically connected to the source-drain electrode metal layer 125, and the OLED devices 131 are energized by the driving circuit layer 120 through the source-drain electrode metal layer 125, allowing a voltage difference to be between the anode 132 and the cathode, thereby driving the light-emitting functional layer of the OLED devices 131 to emit light.

Specifically, the light-emitting functional layer 132 includes a hole injection layer, a hole transport layer, a light-emitting layer, an electron transport layer, and an electron injection layer stacked in a direction from the anode 132 to the cathode. When the voltage difference is between the anode 132 and the cathode, electron holes pass through the hole injection layer and the hole transport layer in turn to reach the light-emitting layer, and ions pass through the electron injection layer and the electron transport layer in turn to reach the light-emitting layer. The electron holes combine with the electrons in the light-emitting layer. The energy generated by the combination causes outermost electrons of a material to be excited, and the electrons cross over to an outer atomic orbital. As it is only excitation, the outermost atomic orbital is unstable, and the outermost electron can immediately return to an original orbit. In this way, excess energy can be released in a form of light, thereby realizing light emission.

Figure 8:
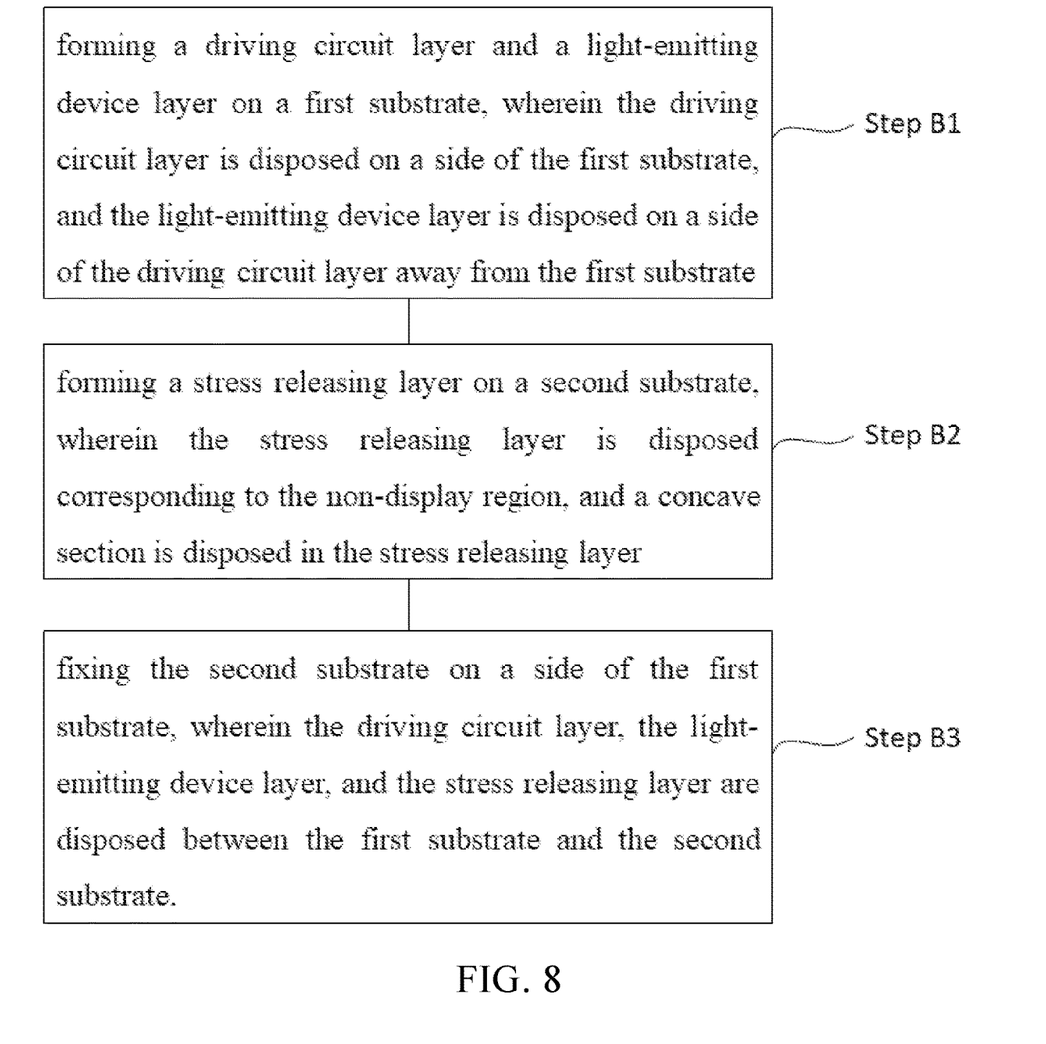
FIG. 8 is a flowchart of a manufacturing method of the display panel provided by one embodiment of the present application.

Please refer to FIG. 8 and combine with FIGS. 1 to 7, one embodiment of the present application further provides a manufacturing method of the aforesaid display panel. The display panel includes a display region 111 and a non-display region 112. The non-display region 112 is located on a side of the display region 111. In one embodiment of the present application, the non-display region 112 is disposed on a peripheral side of the display region 111, i.e., the non-display region 112 is disposed around the display region 111. Of course, the non-display region 112 can be disposed only on one side of the display region 111 according to an actual selection and specific requirements, which is not limited herein. The manufacturing method of the display panel includes following steps:

step B1: forming a driving circuit layer 120 and a light-emitting device layer 130 on a first substrate 110, wherein the driving circuit layer 120 is disposed on a side of the first substrate 110, and the light-emitting device layer 130 is disposed on a side of the driving circuit layer 120 away from the first substrate 110;

step B2: forming a stress releasing layer 231 on a second substrate 210, wherein the stress releasing layer 231 is disposed corresponding to the non-display region 112, and a concave section 233 is disposed in the stress releasing layer 231; and step B3: fixing the second substrate 210 on a side of the first substrate 110, wherein the driving circuit layer 120, the light-emitting device layer 130, and the stress releasing layer 231 are disposed between the first substrate 110 and the second substrate 210. The second substrate 210 can be but is not limited to be fixed to the side of the first substrate 110 by a fixing adhesive 300. In this embodiment, the order of the above step B1 and step B2 can be switched, which is not limited here.

In the embodiments of the present application, by disposing the stress releasing layer 231 having the concave section 233 at the position of the second substrate 210 corresponding to the non-display region 112, when the display panel is bent, the concave section 223 can serve an effect of releasing stress to prevent the stress releasing layer 231 from being fractured when a bending radius is small. Water vapor and oxygen entering the display region 111 from a fragmentation position can be prevented, which can improve reliability of the display panel and reduce failure risk of the display panel.

Specifically, the aforesaid step B2 includes:
step B21: forming a light shielding layer 220 on the second substrate 210, wherein the light shielding layer 220 is disposed corresponding to the display region 111 and the non-display region 112, a plurality of accommodating grooves 221 are defined corresponding to the display region 111 in the light shielding layer 220, and the accommodating grooves 221 are defined to penetrate the light shielding layer 220; and step B22: forming a color filter layer 230 and a stress releasing layer 231 on the second substrate 210, wherein the light shielding layer 230 and the stress releasing layer 231 are disposed on a side of the light shielding layer 220 close to the light-emitting device layer 130, the light filter layer 230 is disposed corresponding to the display region 111, the stress releasing layer 231 is disposed corresponding to the non-display region 112, the color filter layer 230 includes a red color resist 237, a green color resist 238, and a blue color resist 239 disposed in the display region 111, and the red color resist 237, the green color resist 238, and the blue color resist 239 of the display region 111 are disposed in corresponding accommodating grooves 221.

Specifically, in the aforesaid step B22, the stress releasing layer 231 includes a plurality of color resist blocks 232, the plurality of color resist blocks 232 are spaced apart, and the color resist blocks 232 are a stacked structure selected from one or at least two consisting of the red color resist 237, the green color resist 238, and the blue color resist 239. In this configuration, when the color resist blocks 232 include the red color resist 237, the red color resist 237 of the color resist blocks 232 and the red color resist 237 of the display region 111 can be formed simultaneously; when the color resist blocks 232 include the green color resist 238, the green color resist 238 of the color resist blocks 232 and the green color resist 238 of the display region 111 can be formed simultaneously; and when the color resist blocks 232 include the blue color resist 239, the blue color resist 239 of the color resist blocks 232 and the blue color resist 239 of the display region 111 can be formed simultaneously. There is no need to increase masks and processes for manufacturing the color resist blocks 232, this process is simple, flexible, and adjustable.

The display panel and the manufacturing method thereof provided by the embodiments of the present application are described in detail above. This article uses specific cases for describing the principles and the embodiments of the present application, and the description of the embodiments mentioned above is only for helping to understand the method and the core idea of the present application. Meanwhile, for hose skilled in the art, will have various changes in specific embodiments and application scopes according to the idea of the present application. In summary, the content of the specification should not be understood as limit to the present application.

What is claimed is:

1. A display panel, comprising a display region and a non-display region located on a side of the display region, wherein the display panel comprises:
    a first substrate;
    a driving circuit layer disposed on a side of the first substrate;
    a light-emitting device layer disposed on a side of the driving circuit layer away from the first substrate;
    a second substrate disposed opposite to the first substrate, wherein the driving circuit layer and the light-emitting device layer are located between the first substrate and the second substrate; and
    a stress releasing layer disposed on a side of the second substrate close to the first substrate, wherein the stress releasing layer is disposed corresponding to the non-display region, and a concave section is disposed in the stress releasing layer;
    wherein the stress releasing layer comprises a plurality of color resist blocks spaced apart; the concave section comprises a plurality of first grooves extending along a first direction, the plurality of first grooves are arranged along a second direction, the first direction intersects with the second direction; and the first grooves are defined between two adjacent color resist blocks arranged along the second direction; and
    wherein a width of the first grooves is gradually expanded from a direction of the second substrate toward the first substrate.

2. The display panel as claimed in claim 1, wherein the first direction and the second direction are perpendicular.

3. The display panel as claimed in claim 1, wherein the concave section comprises a plurality of second grooves extending along the second direction, the plurality of second grooves are arranged along the first direction, the first grooves communicate with the second grooves, and the second grooves are defined between two adjacent color resist blocks arranged along the first direction.

4. The display panel as claimed in claim 3, wherein a width of the second grooves is gradually expanded from a direction of the second substrate toward the first substrate.

5. The display panel as claimed in claim 1, wherein the concave section comprises via holes defined in the color resist blocks.

6. The display panel as claimed in claim 5, wherein a cross-sectional area of the via holes is gradually expanded from a direction of the second substrate toward the first substrate.

7. The display panel as claimed in claim 5, wherein a cross section of the via holes is circular, oval, or polygonal.

8. A display panel, comprising a display region and a non-display region located on a side of the display region, wherein the display panel comprises:
    a first substrate;
    a driving circuit layer disposed on a side of the first substrate;
    a light-emitting device layer disposed on a side of the driving circuit layer away from the first substrate;
    a second substrate disposed opposite to the first substrate, wherein the driving circuit layer and the light-emitting device layer are located between the first substrate and the second substrate; and
    a stress releasing layer disposed on a side of the second substrate close to the first substrate, wherein the stress releasing layer is disposed corresponding to the non-display region, and a concave section is disposed in the stress releasing layer;
    wherein the stress releasing layer comprises a plurality of color resist blocks spaced apart; the concave section comprises a plurality of first grooves extending along a first direction, the plurality of first grooves are arranged along a second direction, the first direction intersects with the second direction; and the first grooves are defined between two adjacent color resist blocks arranged along the second direction; and
    wherein the color resist blocks are a stacked structure selected from one or at least two consisting of a red color resist, a green color resist, and a blue color resist.

9. The display panel as claimed in claim 8, wherein the display panel comprises a color filter layer, the color filter layer is disposed corresponding to the display region, and the color filter layer comprises the red color resist, the green color resist, and the blue color resist.

10. The display panel as claimed in claim 9, wherein the display panel comprises a light shielding layer, the light shielding layer is disposed on the side of the second substrate close to the light-emitting device layer, a plurality of accommodating grooves are defined corresponding to the display region in the light shielding layer, and the red color resist, the green color resist, and the blue color resist of the display region are correspondingly disposed in the accommodating grooves, and the color resist blocks are disposed on a side of the light shielding layer close to the light-emitting device layer.

11. The display panel as claimed in claim 1, wherein heights of two adjacent color resist blocks are different.

12. The display panel as claimed in claim 1, wherein between two adjacent color resist blocks, one of the two adjacent color resist blocks is one of a red color resist, a green color resist, or a blue color resist, and another one of the two adjacent color resists is a stacked structure comprising two or three of the red color resist, the green color resist, or the blue color resist.

13. The display panel as claimed in claim 1, wherein between two adjacent color resist blocks, one of the two adjacent color resists is a stacked structure comprising two of a red color resist, a green color resist, or a blue color resist, and another one of the two adjacent color resists is a stacked structure comprising the red color resist, the green color resist, or the blue color resist.

14. The display panel as claimed in claim 1, wherein the display panel comprises an encapsulation layer covering the light-emitting device layer, and a thickness of the non-display region of the first substrate is less than a thickness of the display region of the first substrate.

15. The display panel as claimed in claim 14, wherein the driving circuit layer comprises an active layer, a gate insulation layer disposed on a side of the active layer facing away from the first substrate, a gate electrode layer disposed on a side of the gate insulation layer facing away from the active layer, a first insulation layer covering on the gate electrode and the active layer, and a source-drain electrode metal layer disposed on the first insulation layer; and a thickness of a section of the first insulation layer corresponding to the non-display region is less than a thickness of a section of the first insulation layer corresponding to the display region.

16. A manufacturing method of a display panel, wherein the display panel comprises a display region and a non-display region located on a side of the display region, and wherein the manufacturing method of the display panel comprises following steps:

forming a driving circuit layer and a light-emitting device layer on a first substrate, wherein the driving circuit layer is disposed on a side of the first substrate, and the light-emitting device layer is disposed on a side of the driving circuit layer away from the first substrate;

forming a stress releasing layer on a second substrate, wherein the stress releasing layer is disposed corresponding to the non-display region, and a concave section is disposed in the stress releasing layer; and fixing the second substrate on a side of the first substrate, wherein the driving circuit layer, the light-emitting device layer, and the stress releasing layer are located between the first substrate and the second substrate;

wherein the step of forming the stress releasing layer on the second substrate comprises:

forming a light shielding layer on the second substrate, wherein a plurality of accommodating grooves are defined corresponding to the display region in the light shielding layer;

forming a color filter layer and a stress releasing layer on the second substrate, wherein the color filter layer is disposed corresponding to the display region, the stress releasing layer is disposed corresponding to the non-display region, the color filter layer comprises a red color resist, a green color resist, and a blue color resist disposed in the display region, and the red color resist, the green color resist, and the blue color resist of the display region are correspondingly disposed in the accommodating grooves; and disposing the color filter layer and the stress releasing layer on a side of the light shielding layer close to the light-emitting device layer, after the second substrate is fixed on the side of the first substrate.

17. The manufacturing method of the display panel as claimed in claim 16, wherein in the step of forming the color filter layer and the stress releasing layer on the second substrate, the stress releasing layer comprises a plurality of color resist blocks, the plurality of color resist blocks are spaced apart, and the color resist blocks are a stacked structure selected from one or at least two consisting of the red color resist, the green color resist, and the blue color resist.

* * * * *